(12) United States Patent
Vanhatalo

(10) Patent No.: US 8,226,768 B2
(45) Date of Patent: Jul. 24, 2012

(54) APPARATUS FOR EVAPORATION, A CRUCIBLE FOR EVAPORATION AND A METHOD OF GROWING A FILM ON A SUBSTRATE

(75) Inventor: Jari Vanhatalo, Nastringues (FR)

(73) Assignee: DCA Instruments Oy, Turku (FI)

( * ) Notice: Subject to any disclaimer, the term of this patent is extended or adjusted under 35 U.S.C. 154(b) by 438 days.

(21) Appl. No.: 12/469,152

(22) Filed: May 20, 2009

(65) Prior Publication Data

US 2009/0301390 A1     Dec. 10, 2009

Related U.S. Application Data

(60) Provisional application No. 61/058,712, filed on Jun. 4, 2008.

(30) Foreign Application Priority Data

Jun. 4, 2008 (FI) .................................... 20085547

(51) Int. Cl.
C30B 35/00 (2006.01)
C23C 16/00 (2006.01)

(52) U.S. Cl. ........................................ 117/200; 118/726
(58) Field of Classification Search ........................ None
See application file for complete search history.

(56) References Cited

U.S. PATENT DOCUMENTS

| | | | |
|---|---|---|---|
| 3,865,625 A | 2/1975 | Cho et al. | |
| 3,992,233 A | 11/1976 | Farrow | |
| 5,714,008 A | 2/1998 | Lee et al. | |
| 5,827,371 A | 10/1998 | Colombo et al. | |
| 5,858,450 A | 1/1999 | Fujimura et al. | |
| 7,022,192 B2 | 4/2006 | Dip et al. | |
| 2005/0005857 A1 | 1/2005 | Kido et al. | |
| 2006/0147628 A1 | 7/2006 | Hwang et al. | |
| 2008/0019897 A1 | 1/2008 | Salminen et al. | |

FOREIGN PATENT DOCUMENTS

| | | |
|---|---|---|
| JP | 2-125866 | 5/1990 |
| RU | 863717 | 9/1981 |
| WO | 96/35822 | 11/1996 |
| WO | 2007/097329 | 8/2007 |

OTHER PUBLICATIONS

European Search Report dated Sep. 30, 2011.

*Primary Examiner* — Melvin C Mayes
*Assistant Examiner* — Bijay Saha
(74) *Attorney, Agent, or Firm* — Nixon & Vanderhye P.C.

(57) ABSTRACT

The present invention relates to an apparatus for evaporation comprising a vacuum chamber, a substrate stage defining a substrate plane and at least one effusion cell, the effusion cell comprising a crucible having a volume, wherein said effusion cell, crucible and substrate stage are arranged inside the vacuum chamber. The crucible comprises a first end, a second end, at least one side wall and an aperture. In a typical apparatus according to the invention the aperture is situated in the first wall or in a side wall closer to the first end than the second end, the second end arranged closer to the substrate plane than the first end. The invention also relates to a crucible for evaporation, having a volume, comprising a first end, a second end, at least one side wall and an aperture. The invention further relates to a method of growing a film on a substrate.

13 Claims, 4 Drawing Sheets

US 8,226,768 B2

APPARATUS FOR EVAPORATION, A CRUCIBLE FOR EVAPORATION AND A METHOD OF GROWING A FILM ON A SUBSTRATE

This application claims priority under 35 USC §119(a) from Finnish Patent Application No. 20085547 filed 4 Jun. 2008 and claims priority under 35 USC §119(e) from U.S. Provisional Application No. 61/058,712, filed 4 Jun. 2008.

FIELD OF THE INVENTION

The present invention relates to an apparatus for evaporation comprising a vacuum chamber, a substrate stage defining a substrate plane and at least one effusion cell, the effusion cell comprising a crucible having a volume, wherein said effusion cell, crucible and substrate stage are arranged inside the vacuum chamber.

The invention also relates to a crucible for evaporation, having a volume, comprising a first end, a second end, at least one side wall and an aperture.

The invention also relates to a method of growing a film on a substrate by evaporation in a vacuum chamber, comprising at least one effusion cell and a crucible containing source material, comprising placing a substrate inside the vacuum chamber, evaporating atoms or molecules from a source material.

BACKGROUND OF THE INVENTION

In evaporation methods a substrate is placed inside a vacuum chamber. A source material which is to be deposited onto the substrate is also arranged inside the vacuum chamber. The source material is heated to the point where it starts to evaporate. The vacuum allows atoms or molecules to evaporate freely in the chamber and the atoms and molecules subsequently condense on substrate surfaces. This principle is the same for all evaporation methods, only the method used to evaporate the source material differs. There are two popular evaporation methods, which are e-beam evaporation and resistive evaporation. In resistive evaporation, the source material is heated electrically with a high current to make the material evaporate. Molecular beam epitaxy is an evaporation method, which is characterized by a slow deposition rate, which allows a film to grow on the substrate epitaxially i.e. through ordered crystalline growth.

Molecular beam epitaxy (MBE) is a technique for epitaxial growth via the interaction of one or several molecular or atomic beams that occurs on a surface of a heated crystalline substrate. In an MBE vacuum chamber the material to be deposited is heated in a crucible, evaporated and the evaporated molecular beam is directed to a heated crystalline substrate. The evaporated material is in atomic or molecular form depending on the material. The evaporated materials then condense on the substrate, where they may react with each other. The deposition or growth rate is controlled by the temperature of the crucible and mechanical shutters are used to switch the deposition on and off. Typically a plurality of sources are mounted in the deposition chamber in order that several different materials can be evaporated sequentially or simultaneously. MBE is widely used in the semiconductor research and in the semiconductor device fabrication industry. In a typical research MBE system the substrate is facing down, inclined from horizontal with growth surface facing down or the substrate is vertically mounted as shown in the Prior Art FIGS. 1 and 2.

In Prior Art production type MBE devices effusion cells are directed at the substrate at an angle of approximately 45° from the normal of the substrate surface. Conical crucibles are used to provide good uniformity over large area substrates. The patent U.S. Pat. No. 5,827,371 discloses a one-piece monolithic crucible for an MBE effusion source. The maximum temperature of such a crucible made of pyrolytic boron nitride (PBN) is 1400° C. Above this temperature PBN starts to decompose to Boron and Nitrogen. Many applications need higher than 1400° C. temperatures. For example SrTiO2 (STO) layer growth requires Titanium temperatures of 1500-1700° C. STO based technology has major applications for high-k dielectrics in the silicon industry, k referring to a dielectric constant of a material.

Certain high vapor pressure materials such as arsenic, phosphorus, antimony can also be evaporated using a thermal cracker source which cracks the evaporated source materials to dimers or monomers. These cracker sources have heated crucibles to evaporate the source material, a cracker stage to crack the molecules to dimers or monomers and a control valve between the crucible and the cracker to control the effusion rate from the cracker. A description of such cracker source for phosphorus is contained in US20080019897A1.

A problem associated with existing production MBE vacuum chambers is that the substrate growth surface is facing down which requires the substrates to be loaded and unloaded into the vacuum chamber using carrier rings. The downward facing growth is not compatible with existing semiconductor process equipment which typically have the growth surface facing up and which do not use substrate carriers.

In Prior Art MBE effusion cells the flux rate from the source depends on the height of the material level in the crucible. Prior Art MBE effusion cells have a limited crucible capacity when using liquid source materials. The material flux out of the crucible consists of two parts: atoms or molecules emitted from the melt level directly to the substrate without reflections from the crucible walls and atoms or molecules going through one or more reflections from crucible walls before reaching the substrate. With prior art crucibles the depletion of the source material causes the surface area of the melt to diminish, which in turn may lead to a diminishing material flux to the substrate.

In MBE vacuum chambers, large amounts of deposits are accumulated on the chamber walls and other structures inside the deposition chamber over time. These deposits are typically loosely attached and fall down easily. Any deposit falling back in to the crucible will contaminate the source material and result in impurities and defects in the deposited thin film.

A silicon substrate may develop a dislocation called "slip" while subjected to high-temperature processing. If such a slip extends into an integrated circuit, the circuit will suffer failures like increased leakage and dielectric breakdown. Such a defect is more likely to occur if the silicon substrate is held in place from the substrate edges with a carrier ring used in a typical MBE apparatus. Damage to silicon wafers caused by gravity when the wafer is held from the edges only is discussed, for example in U.S. Pat. No. 7,022,192. In Prior Art MBE systems the silicon wafer cannot be supported at any other point because this would damage the growth surface. In the present invention the wafer can be held from the back side so there is no damage to the front side growth surface.

OBJECTS OF THE INVENTION

The object of the invention is to minimise or even eliminate the problems existing in the Prior Art.

One object of the present invention is to provide an evaporation apparatus which is compatible with standard semiconductor industry robotic wafer handlers.

Another object of the invention is to increase crucible capacity when using liquid sources.

A further object of the present invention is to reduce contamination effects from falling deposits from the deposition chamber walls or other structures inside the vacuum chamber.

Another object of the invention is to reduce the effects of the depletion of source materials on deposition rate.

A further object of the invention is to provide an evaporation apparatus and method in which large diameter silicon substrates can be heated to high temperatures without slip lines or similar defects.

DETAILED DESCRIPTION OF THE INVENTION

The present invention relates to an evaporation apparatus and a method for evaporation.

An apparatus for evaporation according to the present invention comprises a vacuum chamber, a substrate stage defining a substrate plane and at least one effusion cell, the effusion cell comprising a crucible having a volume, wherein said effusion cell, crucible and substrate stage are arranged inside the vacuum chamber, the crucible comprising a first end, a second end, at least one side wall and an aperture. In a typical apparatus according to the present invention the aperture is situated in the first end or in a side wall closer to the first end than the second end, the second end being closer to the substrate plane than the first end.

The invention also relates to a crucible for evaporation, having a volume, comprising a first end, a second end, at least one side wall and an aperture. In a typical apparatus according to the invention the aperture is arranged in the side wall of the crucible and the crucible comprises a conical part able to be attached or attachable to the aperture, outside the main crucible volume. The part of the crucible defining the main crucible volume and the conical part may be essentially a single object or they may be essentially separate objects.

The invention further relates to a method of growing a film on a substrate by evaporation in a vacuum chamber, comprising at least one effusion cell and a crucible containing source material, comprising placing a substrate inside the vacuum chamber, evaporating atoms or molecules from a source material and directing evaporated atoms or molecules towards a surface of said substrate. In a typical method according to the invention the direction of the flow of atoms or molecules from the effusion cell is downwards at an angle β, at least 1° from horizontal.

The invention further relates to a method of growing a film on a substrate by evaporation in a vacuum chamber comprising at least one effusion cell and a crucible containing source material, comprising placing a substrate inside the vacuum chamber, evaporating atoms or molecules from the source material. In a typical method according to the invention all atoms or molecules are directed towards a surface of said substrate along a curved path.

In the present application the term "vacuum chamber" refers to a vacuum chamber which may, for example, be a high vacuum chamber or an ultra high vacuum chamber, which can be used to grow a film on a substrate surface. An ultra high vacuum chamber may be characterized by a pressure of $10^{-7}$ Pa or lower.

In the present application the term "effusion cell" refers to an object comprising a crucible. An effusion cell may also comprise a radiation shield and a heating filament. The term "crucible" refers to an object containing the source material.

The crucible may also comprise a conical part. The term "conical part" refers to an essentially cone-shaped object which is used to direct the flow of material from the main crucible volume, which normally contains the source material, to a surface of a substrate.

In the present application the term "growth surface" refers to the surface of a substrate onto which a film can be grown.

In the present application the term "substrate stage" refers to an object arranged inside the vacuum chamber onto which a substrate can be placed. The term "substrate plane" refers to an imaginary plane defined by the plane-like surface, for example the growth surface, of a substrate placed onto the substrate stage when the apparatus is in use.

In the present application the term "downwards" refers to a direction that may comprise the direction of gravitational force but not the direction counter that of gravitational force, for example. In the present application the terms "upward" or "upwards" refer to a direction that may comprise the direction counter that of gravitational force, but not the direction of gravitational force, for example.

The crucible is machined, for example, from high semiconductor grade graphite or similar material compatible with the source materials. The crucible could also be machined from tantalum, titanium and ceramic materials such as aluminium oxide and pyrolytic boron nitride. The graphite crucible can be coated with a suitable material, for example titanium carbide, silicon carbide or pyrolytic graphite. The shape of the crucible may for example be essentially cylindrical or rectangular. The volume of the crucible may be from 1, 2, 5, 7 liters up to 3, 5, 7, 10 liters, for example.

The shape of the edge defining the aperture may be essentially circular, having a diameter for example from 0.5 cm, 1 cm up to 1 cm, 1.5 cm, 3 cm.

A resistive heating filament may surround the crucible and can be of single filament type or consist of multiple filament sections to provide a heating profile along the crucible. The crucible may be heated up to 2000° C., depending on the crucible material. The substrate may also be heated, the required temperature depending on the process.

The substrate may be rotated during the deposition of a film to provide uniform deposition on the substrate. A mechanical shutter may be placed between the effusion cell and substrate in order to switch on and off the deposition process.

The source material may be in liquid or solid form. Several materials may be evaporated at the same time, some materials may be in liquid form and some in solid form.

According to an embodiment of the invention the apparatus is used for molecular beam epitaxy.

According to an embodiment of the invention the film is grown by molecular beam epitaxy.

According to an embodiment of the invention the shape of the crucible is essentially cylindrical whereby the side wall is essentially the curved surface area of the cylindrical crucible.

According to an embodiment of the invention, a conical part is attached to the aperture, in such a way that the conical part is outside the main crucible volume, in order to direct a flow of atoms or molecules from the crucible towards the substrate stage. The conical part may be surrounded by a resistive heating element. The conical part is heated to a higher temperature than the main part of the crucible. The temperature difference may be small, for example a few degrees. The conical part has an exit aperture through which the atoms or molecules travel to the substrate. The shape of the exit aperture of the conical part may be essentially circular having a diameter from 2, 4 cm up to 3, 4, 5 cm, for example. The inlet aperture of the conical part is such that the conical part may be attached to the edges defining the aperture in the crucible side wall. The inlet aperture may have a diameter, for example, from 0.5 cm, 1 cm up to 1 cm, 1.5 cm, 3 cm.

According to an embodiment of the invention when the apparatus is in use the conical part is arranged above the substrate stage.

According to an embodiment of the invention when the apparatus is in use the conical part is arranged to open downwards towards the substrate stage.

According to an embodiment of the invention the walls of the conical part are arranged to direct substantially the whole flow of atoms or molecules downwards, in an angle from horizontal. The angle from horizontal may for example be from 10°, 15°, 20° up to 45°, 55°, 65°, 80°.

According to an embodiment of the invention the side wall of at least one crucible forms an angle α, 0°-90° from horizontal. The angle may be from 5°, 10°, 30°, 40° up to 50°, 60°, 70°, 80°, for example. If the shape of the crucible is essentially cylindrical, the direction of the normal of the top or bottom of the cylinder shape also form the angle α from horizontal. In an embodiment of the invention the angle is such that when the apparatus is in use the direction of atoms or molecules leaving an essentially cylindrical crucible comprising a conical part is downwards towards a substrate which has a growth surface pointing upwards. The substrate stage may be in any angle from horizontal, excluding an essentially perpendicular angle, as long as the growth surface faces upwards.

According to an embodiment of the invention the substrate stage is substantially horizontal.

According to an embodiment of the invention the vacuum chamber comprises at least two effusion cells. The vacuum chamber may also contain for example from 2, 4, 6 effusion cells up to 3, 4, 6, 8 effusion cells. The chamber may be equipped with effusion cell ports, for example from 2 up to 10, 12 ports. The term "effusion cell port" refers to an inlet for the effusion cells into the vacuum chamber.

According to an embodiment of the present invention the substrate is transferred to the substrate stage using an automatic means, for example, using a robotic wafer handler. This embodiment of the invention increases the usable surface area of the wafer with respect to prior art devices. The prior art devices require a carrier ring which covers a band approximately 3 millimeters wide on the edge of the wafer surface. For example, for a wafer with a diameter of 300 mm (30 cm) the increase in usable surface area may be approximately 55 cm$^2$. For a wafer with a diameter of 450 mm (45 cm) the increase in usable surface area may be approximately 85 cm$^2$.

According to an embodiment of the invention a valve member is arranged between the conical part and the main crucible volume. The flow of material from the crucible to the substrate surface may be controlled using the valve member.

According to an embodiment of the invention, when the apparatus is in use, a deposition shield is arranged above the substrate stage. The deposition shield protects the substrate growth surface from contamination, such as dust or flakes. The deposition shield may be for example, circular or rectangular in shape. The deposition shield may cover the whole surface of the substrate. The diameter of the deposition shield may be for example from approximately 300 mm up to 350, 400, 450, 500, 550 mm. The deposition shield may be placed parallel to the substrate surface or at an angle to the substrate surface. The deposition shield may be heated, for example up to 450° C. The shield may be heated using at least one resistive heating element, for example. The heating can be used to evaporate accumulated contaminants.

According to an embodiment of the invention a film is grown on a surface of a substrate in a substantially upward direction, the substrate being in a non-perpendicular angle from horizontal.

According to an embodiment of the invention the direction of flow of atoms or molecules from at least one effusion cell forms an angle γ of 30°-60° from horizontal.

According to an embodiment of the invention, atoms or molecules from the source material travel to the substrate along a curved path. The atoms or molecules evaporated from the source material travel first in an essentially upward direction, bounded by the walls of the crucible, from the surface of the source material and then through the aperture in the crucible wall and through the conical part, where they are directed essentially downwards and towards a substrate surface.

According to an embodiment of the invention all atoms or molecules from the surface of the source material travel to the substrate along a curved path.

According to an embodiment of the invention a layer is formed on the substrate surface from reactants comprising strontium, titanium and oxygen. The term "reactant" refers to a reacting substance. From the above-mentioned reactants Strontium titanate (STO, SrTiO3) may be formed.

According to an embodiment of the invention there is no direct line of sight between the surface of the source material and the substrate.

According to an embodiment of the invention the flux of atoms or molecules from the source material to the substrate remains essentially constant during the deposition process. Typically, the vapour pressure in the main crucible volume remains essentially constant. In a cylindrical crucible, for, example, the surface area of the source material melt remains essentially constant.

It is clear that also all the other details and embodiments described above in connection with the apparatuses may be used in the present methods and the details and embodiments described above in connection with the methods may be used in the present apparatuses.

DETAILED DESCRIPTION OF THE DRAWING

Figure 1:
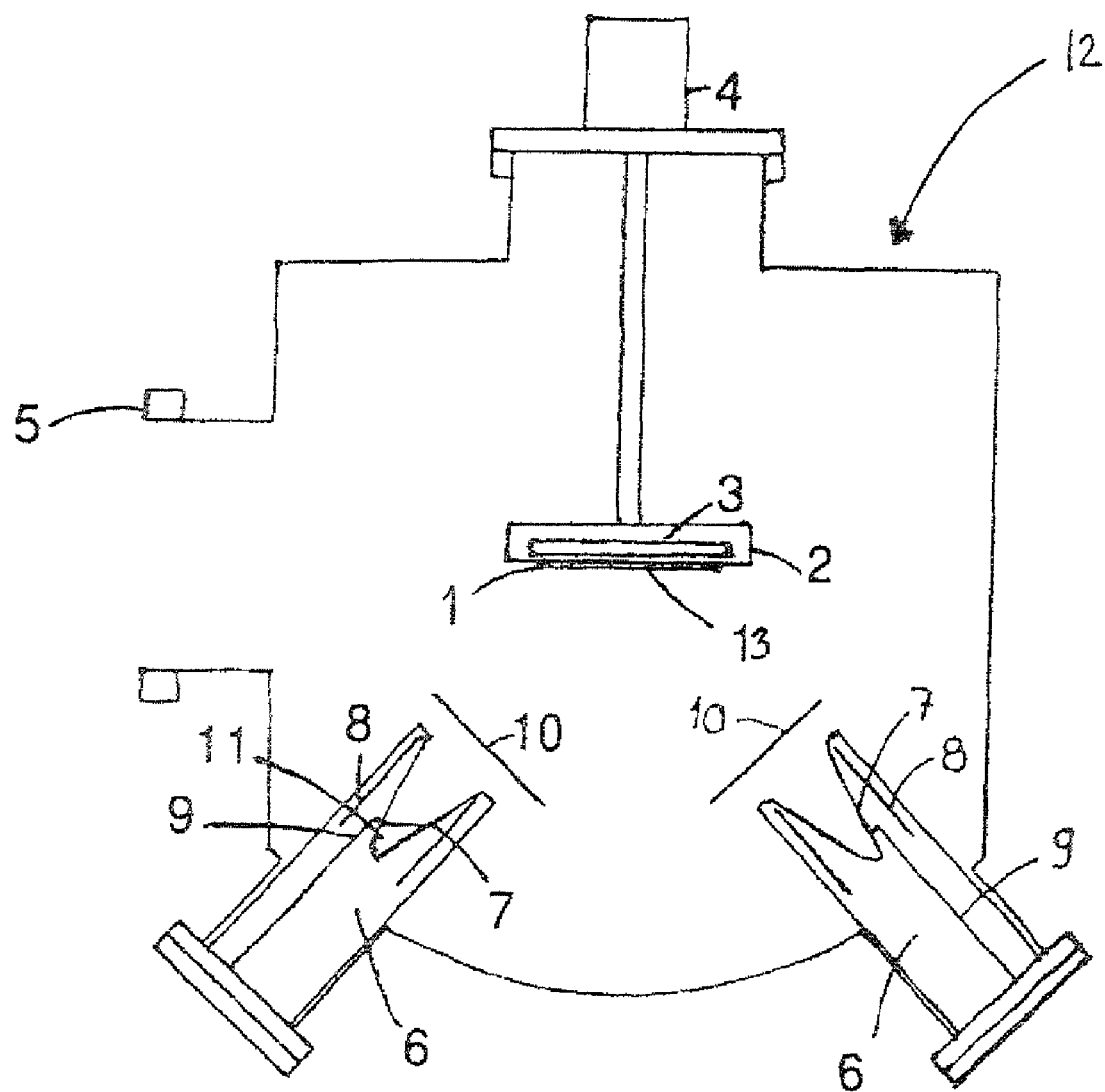
FIG. 1 illustrates a Prior Art molecular beam epitaxy device.

FIG. 1 illustrates a Prior Art molecular beam epitaxy device. The figure shows two effusion cells 6 arranged inside an ultra high vacuum chamber 12. A beam containing atoms or molecules may be directed from the effusion cells 6 to a substrate 1 surface. The substrate 1 is attached to a rotary substrate heater stage 2 which comprises a substrate heater 3. The effusion cell 6 has a crucible 7 which contains the source material 11. The crucible 7 comprises a crucible heater 8. The effusion cell 6 crucible temperature (and thereby the effusion rate) is controlled using a thermocouple 9. The source material 11 in one of the crucibles 7 is in liquid form. A mechanical shutter 10 is used between the effusion cell 6 and the substrate 1 to switch the atomic or molecular beam on and off. The ultra high vacuum chamber 12 is equipped with a rotary vacuum feedthrough 4 and a connection port to a vacuum pump 5. The crucibles 7 are situated at an approximately 45° degree angle form the normal of the substrate 1 surface. The arrangement is such that a film is grown on the substrate 1 growth surface 13 facing substantially downwards. Due to the form of the crucibles 7 the volume of the crucibles is restricted when using liquid materials.

Figure 2:
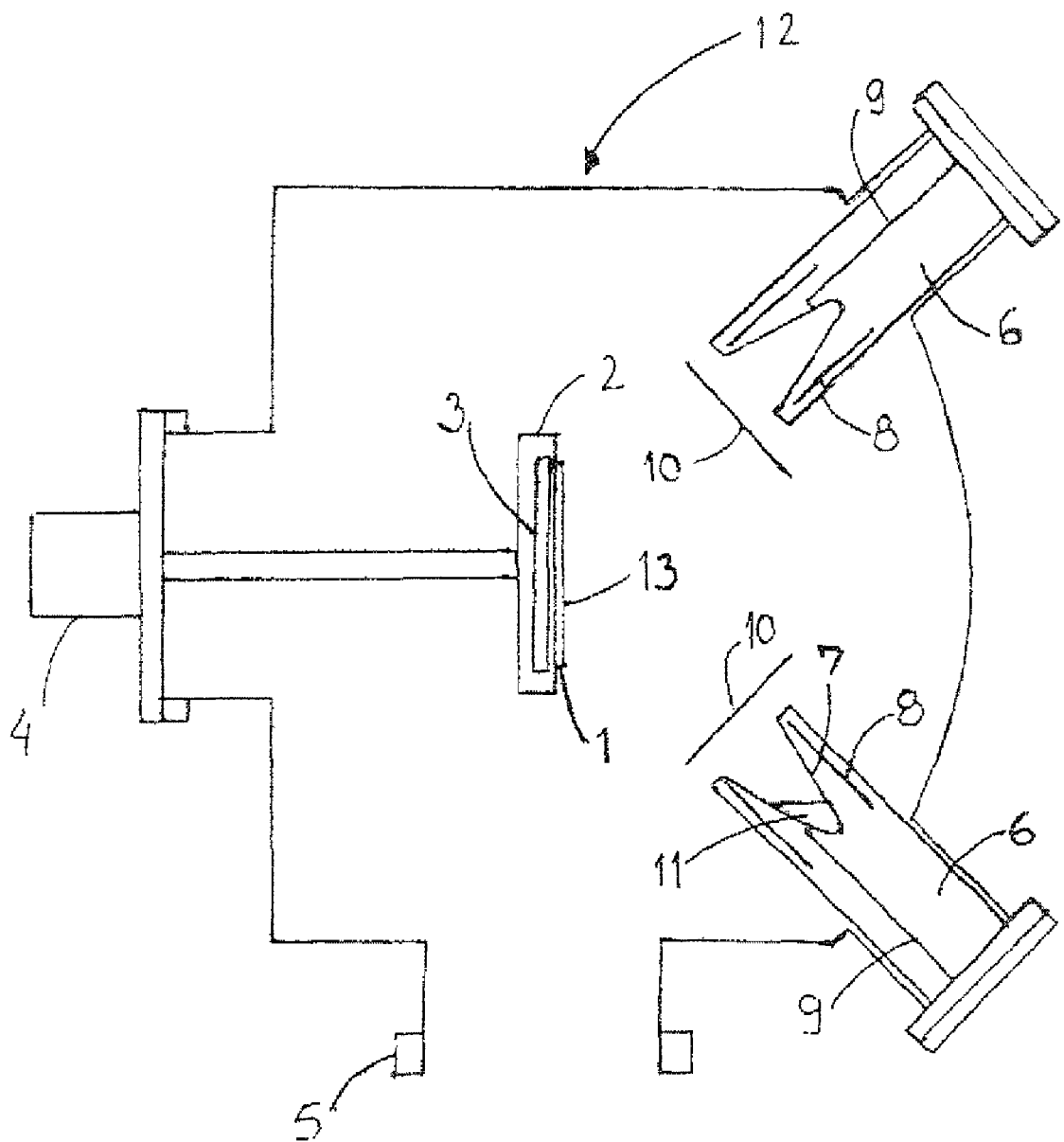
FIG. 2 illustrates a Prior Art molecular beam epitaxy device.

FIG. 2 illustrates a Prior Art molecular beam epitaxy device. The device comprises essentially the same parts as Prior Art device of FIG. 1. The device differs from the Prior Art device of FIG. 1 in the placement and angle of the substrate 1 and effusion cells 6. The substrate stage 2 in FIG. 2 is essentially vertical.

Figure 3:
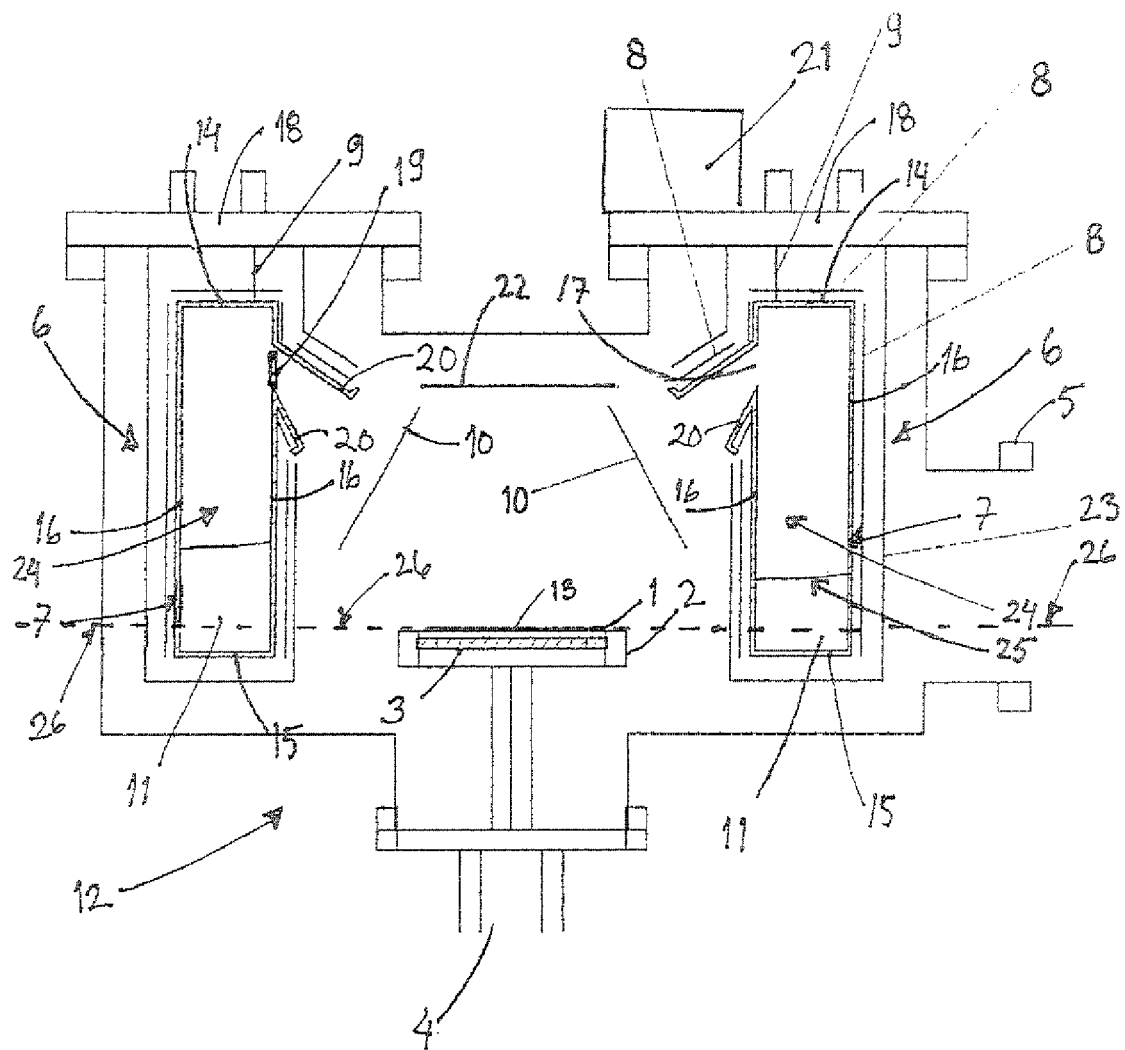
FIG. 3 illustrates schematically an embodiment of the invention.

FIG. 3 illustrates an embodiment of the invention. The figure shows an ultra high vacuum chamber 12 with a pressure of $10^{-7}$ Pa or lower. The vacuum chamber 12 is equipped with a rotary vacuum feedthrough 4 for substrate 1 rotation and a connection port to a vacuum pump. The substrate 1 is loaded into the vacuum chamber 12 and transferred to the substrate stage 2 using a robotic wafer handler 21. For a wafer with a diameter of 300 mm (30 cm) the increase in usable surface area with respect to Prior Art devices is up to 55 cm$^2$.

Inside the vacuum chamber 12 are two effusion cells 6 containing crucibles 7. The crucibles 7 contain the source material 11 to be evaporated. The crucibles comprise a side wall 16, a first end 14 and a second end 15. An aperture 17 is situated in the side wall 16 closer to the first end 14 than the second end 15. The crucibles 7 are machined from high semiconductor grade graphite. The graphite crucible can be coated with titanium carbide. The shape of the crucibles 7 is essentially cylindrical. The source material 11 is heated using resistive heating filaments 8 that surround the crucibles 7. The crucible heaters 8 consist of multiple filament sections to provide a heating profile along the crucibles 7. The crucibles 7 are heated to 1700° C., in order to facilitate production of strontium titanate. The effusion rate from the crucible 7 is controlled using a thermocouple 9. A radiation shield 23 surrounds the crucible 7. The crucible heating assembly 8 and radiation shield 23 are attached to a connecting flange 18 which is used to mount the thermal source into a vacuum chamber port. The rotary substrate heater stage 2 comprises a substrate heater 3. The substrate 1 is heated and rotated during deposition. When producing strontium titanate Sr is in solid form and Ti may be in liquid or solid form. Side walls 16 of both crucibles 7 form an angle α, 90° from horizontal. The substrate stage 2 is substantially horizontal. A mechanical shutter 10 is used to switch the atomic or molecular beam on and off. The crucibles 7 comprise a conical part 20 which is arranged above the substrate stage 2. The conical parts 20 open downwards towards the substrate stage 2 and the walls of the conical parts 20 direct substantially the whole flow of atoms or molecules downwards, in an angle from horizontal. The conical parts 20 are surrounded by resistive heating elements 8. The conical parts 20 are heated to a higher temperature than the main part of the crucible 7.

The flow of atoms or molecules is controlled by a valve member 19 between the conical part 20 and the main volume of the crucible 24. The atoms or molecules from the source material 11 travel to the substrate 1 along a curved path. The atoms or molecules evaporated from the source material 11 travel first in an essentially upward direction, bounded by the walls of the crucible 7, from the surface of the source material 11 and then through the aperture 17 in the crucible 7 wall and through the conical part 20, where they are directed essentially downwards and towards a substrate 1 surface. There is no direct line of sight between the surface of the source material 11 and the substrate 1. The flux of atoms or molecules from the source material 11 to the substrate 1 remains essentially constant during the deposition process. The vapour pressure in the main crucible volume 24 remains essentially constant.

The substrate 1 is shielded from debris falling from the vacuum chamber walls by a deposition shield 22. The deposition shield 22 is heated by a resistive heater. The deposition shield 22 is placed parallel to the substrate 1 surface. The deposition shield is heated to 450° C. The heating evaporates accumulated contaminants.

Figure 4:
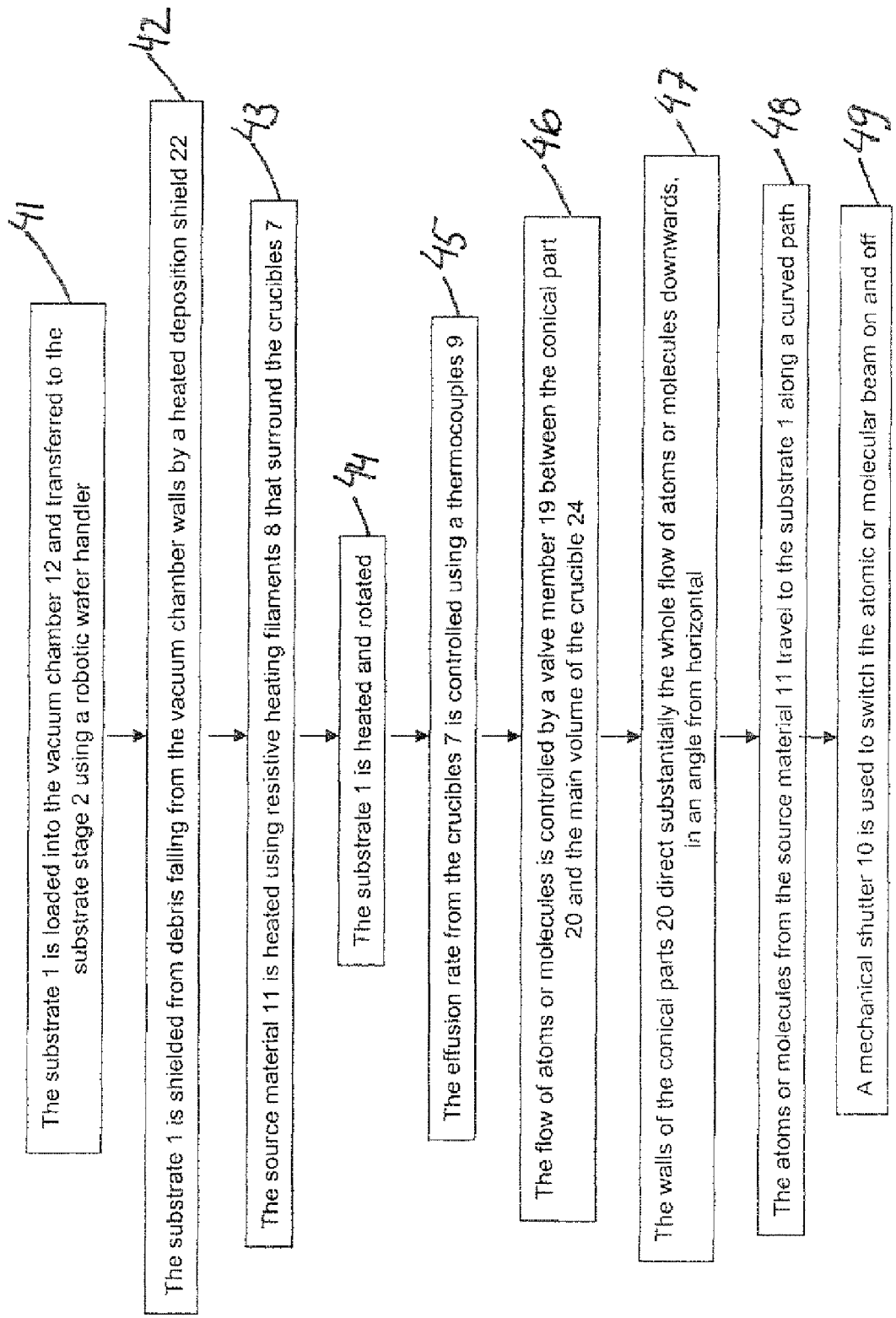
FIG. 4 flowchart describing an embodiment of the invention.

FIG. 4 shows a flowchart describing an embodiment of the invention. In stage 41 the substrate 1 is loaded into the vacuum chamber 12 and transferred to the substrate stage 2 using a robotic wafer handler. In stage 42 the substrate 1 is shielded from debris falling from the vacuum chamber walls by a heated deposition shield 22. In stage 43 the source material 11 is heated using resistive heating filaments 8 that surround the crucibles 7. In stage 44 the substrate 1 is heated and rotated. In stage 45 the effusion rate from the crucibles 7 is controlled using thermocouples 9. In stage 46 the flow of atoms or molecules is controlled by a valve member 19 between the conical part 20 and the main volume of the crucible 24. In stage 47 the walls of the conical parts 20 direct substantially the whole flow of atoms or molecules downwards, in an angle from horizontal. In stage 48 the atoms or molecules from the source material 11 travel to the substrate 1 along a curved path. In stage 49 a mechanical shutter 10 is used to switch the atomic or molecular beam on and off.

The invention claimed is:

1. An apparatus for evaporation comprising a vacuum chamber, a substrate stage defining a substrate plane and at least one effusion cell, the effusion cell comprising a crucible having a volume, wherein said effusion cell, crucible and substrate stage are arranged inside the vacuum chamber, the crucible comprising:
   a first end,
   a second end,
   at least one side wall, and
   an aperture, wherein
   the aperture is situated in a side wall of the crucible closer to the first end than the second end, the second end being arranged closer to the substrate plane than the first end.

2. An apparatus according to claim 1, wherein the apparatus is used for molecular beam epitaxy.

3. An apparatus according to claim 1, wherein the crucible has a shape which is essentially cylindrical whereby the side wall is essentially the curved surface area of the cylindrical crucible.

4. An apparatus according to claim 1, further comprising a conical part attached to the aperture, outside a main crucible volume, in order to direct a flow of atoms or molecules from the crucible towards the substrate stage.

5. An apparatus according to claim 4, wherein, when in use, the conical part is arranged above the substrate stage.

6. An apparatus according to claim 5, wherein, when in use, the conical part is arranged to open downwards towards the substrate stage.

7. An apparatus according claim 6, wherein, when in use, the walls of the conical part are arranged to direct substantially the whole flow of atoms or molecules downwards, in an angle from horizontal.

8. An apparatus according to claim 4, wherein a valve member is arranged between the conical part and the main crucible volume.

9. An apparatus according to claim 1, wherein a side wall of at least one crucible forms an angle α, 0°-90° from horizontal.

10. An apparatus according to claim 1, wherein the substrate stage is substantially horizontal.

11. An apparatus according to claim 1, wherein the vacuum chamber comprises at least two effusion cells.

12. An apparatus according to claim 1, further comprising a means for automatically placing a substrate on to the substrate stage.

13. An apparatus according to claim 1, wherein, when in use, a deposition shield is arranged above the substrate stage.

* * * * *